United States Patent [19]

Dodds

[11] 4,295,695
[45] Oct. 20, 1981

[54] ELECTRICAL CONNECTORS

[75] Inventor: Robert J. Dodds, Crewe, England

[73] Assignee: International Computers Limited, London, England

[21] Appl. No.: 82,095

[22] Filed: Oct. 5, 1979

[30] Foreign Application Priority Data

Oct. 12, 1978 [GB] United Kingdom ............... 40355/78
Oct. 21, 1978 [GB] United Kingdom ............... 41471/78

[51] Int. Cl.³ ............................................. H01R 1/11
[52] U.S. Cl. ................................... 339/17 F; 29/825
[58] Field of Search ............... 339/17 F, 17 E, 17 M, 339/17 LM, 19, 176 MF; 361/398, 414; 29/825

[56] References Cited

U.S. PATENT DOCUMENTS

| | | | |
|---|---|---|---|
| 3,253,248 | 5/1966 | Brown | 339/17 F |
| 3,701,078 | 10/1972 | Lynch | 339/19 |
| 3,723,635 | 3/1973 | Smith | 361/398 |
| 3,727,168 | 4/1973 | Henschen et al. | 339/17 F |
| 3,967,162 | 6/1976 | Ceresa et al. | 339/61 M |

OTHER PUBLICATIONS

Connectors for Flat-Conductor Flexible Cables, Angele, Electrical Manufacturing, 8-1960.

*Primary Examiner*—Neil Abrams
*Attorney, Agent, or Firm*—Hane, Roberts, Spiecens & Cohen

[57] ABSTRACT

An edge connector assembly (1) for interconnecting two printed circuit boards (2) in such manner as to maintain a one-to-one correspondence with the opposite sides of the boards, the assembly (1) including a flexible substrate (10) carrying a conductor pattern (10A) which connects with contact areas (12) and the substrate (10). The substrate (10) is folded or flexed about two support strips (11) such that the parts of the substrate (10) wrapped around the strips (11) provide the edge connector (5) and other parts of the substrate (10) maintain the edge connections (5) in spaced relationship. The various contacts (12) are so positioned on the substrate (10) that they are located on opposite faces of the edge connectors (5). Plated through holes (27,28) are formed in the substrate to provide any required electrical connection through the substrate (10).

9 Claims, 6 Drawing Figures

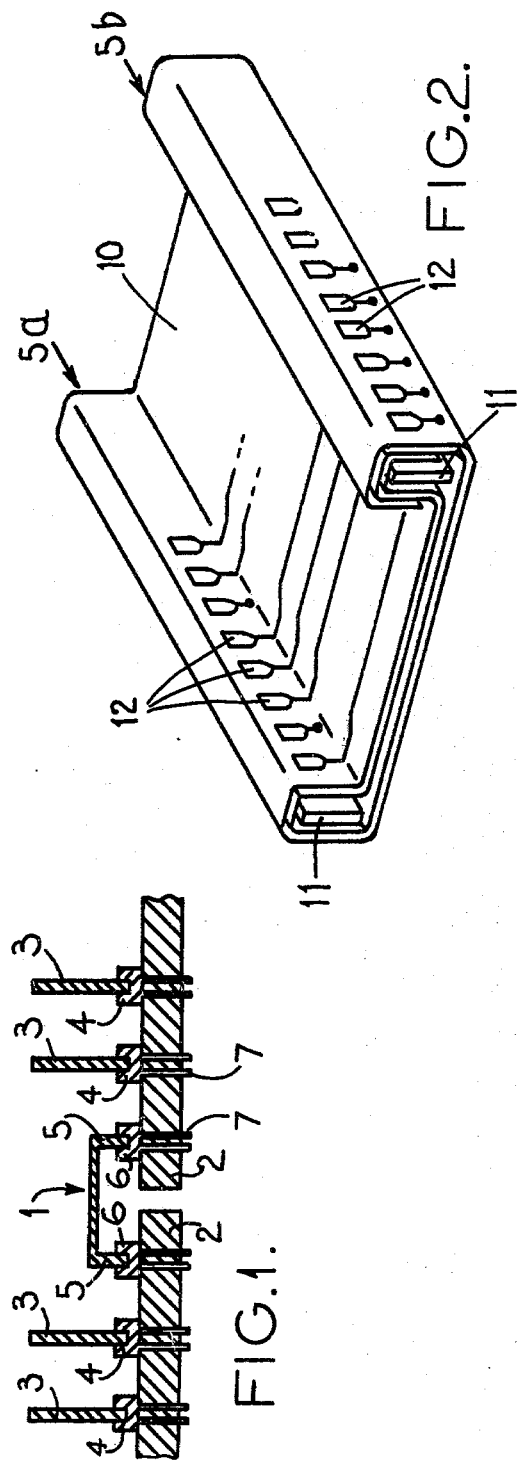

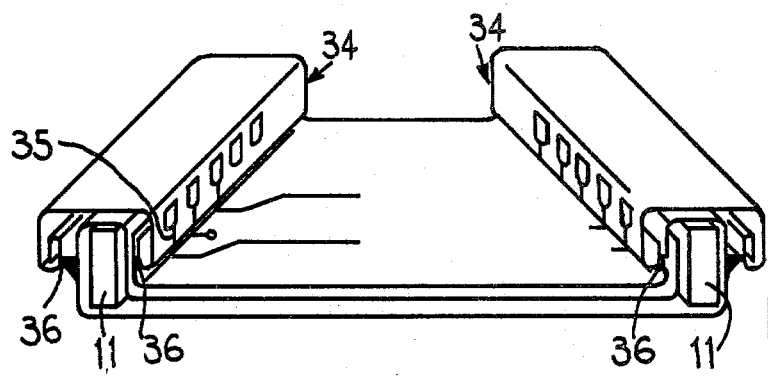
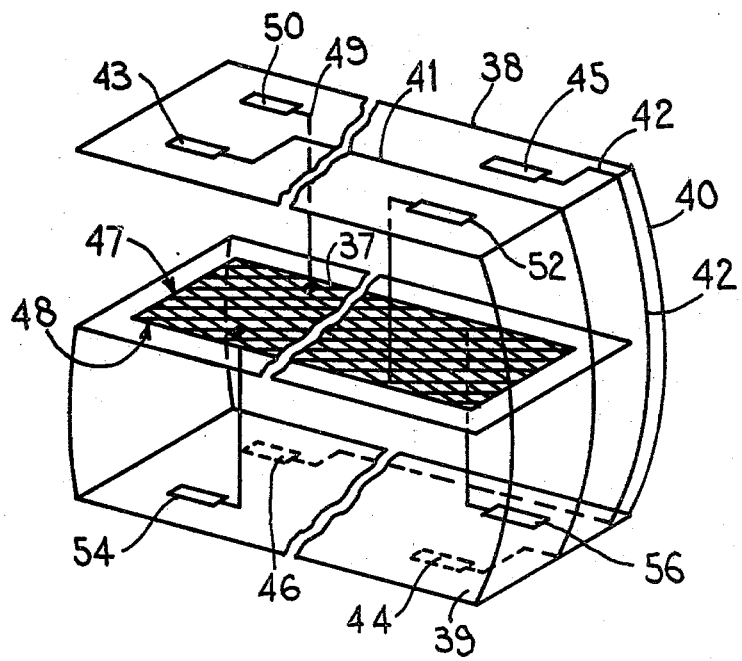

ELECTRICAL CONNECTORS

BACKGROUND OF THE INVENTION

This invention relates to electrical connectors.

THE PRIOR ART

Edge connector assemblies have been proposed including a main portion and end regions of which one or both such regions fits into an edge connector of the type that has a slot with two internal opposed faces each carrying contacts. The need can arise for such connector assemblies to provide connections between contacts carried by one face of an edge connector with contacts carried by what may be called the opposite face of the other edge connector. The object of this invention is to provide such a connector assembly. It has been proposed to do so by a connector arrangement in which twisted wires provide the required crossover.

SUMMARIES OF THE INVENTION

According to this invention there is provided a connector assembly for interconnecting first and second connection units each having a first and second series of contacts located upon opposite sides of a connection region, in such manner that the first contact series of the first and second units are interconnected and the second contact series of the first and second units are interconnected, the assembly including two edge connector members adapted for connection with said units and each carrying pluralities of contacts intended for co-operation with said first and second series of contacts, these pluralities of contacts being located on opposite regions of the respective edge connector members, and at least one contact of each of the plurality of contacts is connected to at least one contact of the plurality of contacts of the plurality of contacts of the other edge connector member on the opposite regions by a conductor path which is at least in part formed on a flexible substrate, which is deformed or otherwise folded such that portions thereof lie in side-by-side relationship, and in such manner that the conductor path is carried from one side of the connector assembly to the other.

The edge members may each be an edge strip, the two pluralities of contacts carried by it being on opposite faces of the strip. As an alternative the edge members may each carry contacts on two opposed internal faces. Preferably there is a region of flexure of the substrate in the neighbourhood of an edge member, which region is crossed by at least one path connecting contacts from one side of one edge member to the opposite side of the other edge member, and at least one path connecting contacts from the other side of the said one edge member to the opposite side of the said other edge member. Prefereably the substrate is flexed at least twice in the same sense to form an inner section, a first outer section joined to the inner section by a first region of flexure and a second outer section joined to the first outer section by a second region of flexure which region takes the second outer section round to the opposite side of the inner section to the first outer section, the inner section carrying at least one conductor path connected to contacts of both edge strips. This arrangement allows a greater complexity of connections between the contacts of the two edge members. For example, the inner section may carry an effectively uniform conductor pattern and the said two outer sections may then carry conductor paths crossing the second region of flexure. The effectively uniform conductor may then act as a ground plane.

The contacts may be provided on the flexible substrate. Alternatively they may be provided separately and electrically joined to the conductor paths on the substrate. The invention also provides an interconnection system comprising two printed circuit boards connected by a connector according to the invention.

BRIEF DESCRIPTION OF THE DRAWINGS

Two forms of connector according to the invention, and an interconnection system of which they may form a part, will now be described in greater detail by way of example with reference to the accompanying drawings, in which:

FIG. 1 is a cross-section of the interconnection system;

FIG. 2 is a view of the first form of connector.

FIG. 3 is a plan of the substrate forming part of the first form of connector laid out flat;

FIG. 5 is a view of the second form of connector; and

FIG. 6 is a view of the substrate of the second form folded.

DESCRIPTION OF THE PREFERRED EMBODIMENT

Figure 4:
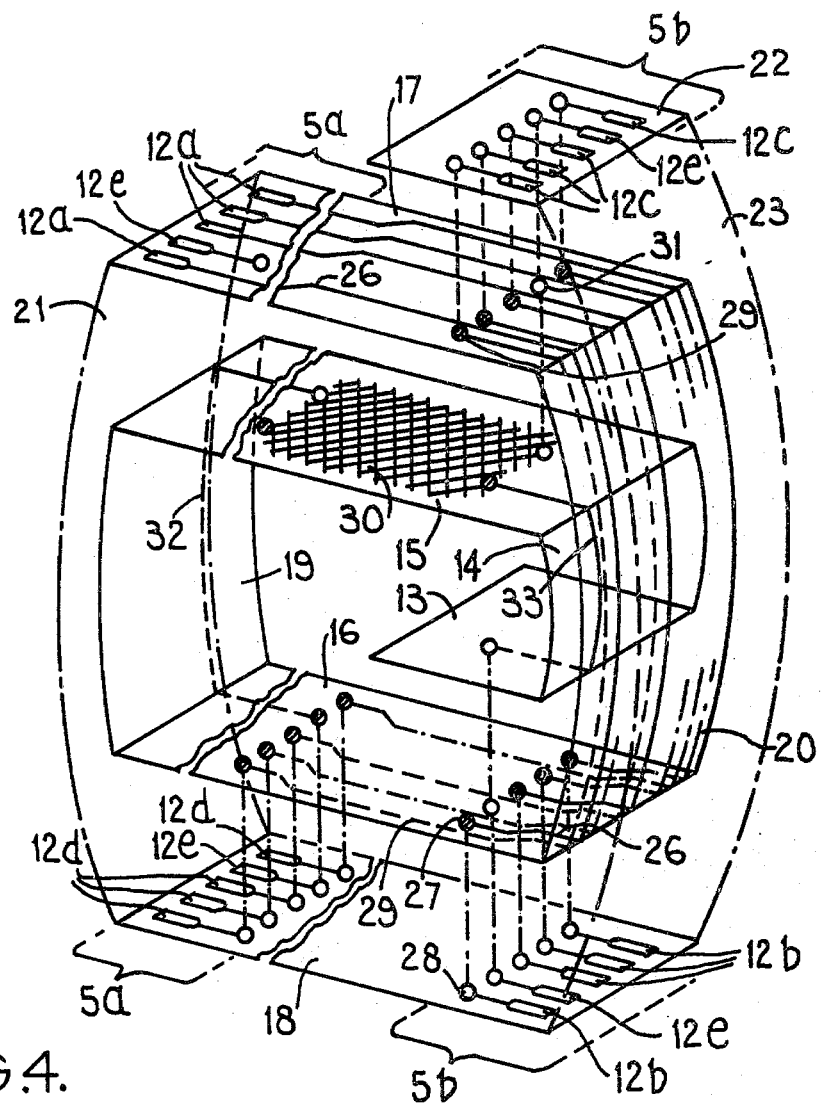
FIG. 4 is a diagrammatic view of the substrate of the first form folded.

Both forms of connector assembly to be described may be used in an interconnection system such as is shown in FIG. 1. The connector assembly, indicated in FIG. 1 by the reference numeral 1, connects two multi-layer printed circuit boards 2. The boards 2 lie side by side in the same general plane and are backplanes or mother boards for printed-circuit boards 3 which may carry circuit components. The boards 3 are are mounted in edge connectors 4, each of which connectors is slotted to receive a board 3. Each such connector carries contact areas which make contact with matching contact areas on the edge of each face of the board 3. The connector 1 has two edge connector units or strips 5 which carry contacts similar to those on the board 3 and which fit into two edge connectors 6, similar to the edge connectors 4 and mounted one on each board 2. The contact areas of the edge connectors 4 and 6 are connected to pins 7 which in turn are connected to conductive tracks or planes such as ground planes of the board 2. Although only one connector 1 is shown, for additional interconnections between the boards there may be additional connectors 1 overlying the connector 1 shown and fitting into additional edge connectors 6 provided on the board 2.

The purpose of the connector assembly 1 in the system of FIG. 1 is to connect various signal tracks of the boards 2 to each other so that signals may be transmitted from one board 2 to the other, and also to interconnect the ground planes of the two boards in such a manner as to impact the appropriate electrical characteristics to the signal connections.

The arrangement of the boards 2 in this system is such that contact areas on the left hand side of one edge connector 6 must be connected to contact areas on the left hand side of the other edge connector 6; and similarly contact areas on the right hand sides of the two edge connectors must be connected to each other. The connector 1 must therefore provide for a one-to-one correspondence between the sides and thus must provide for the connections between these contact areas to cross from one side of the connector to the other.

Referring to FIG. 2, the first form of connector assembly is formed from a single strip 10 of flexible material which is deformed i.e. flexed at various locations within the overall structure of the connector assembly by being wound several times around two packing strips 11. The connector assembly is secured by adhesive between the layers and adopts the configuration shown, with the two edge connection units or strips (distinguished as 5a and 5b) containing the packing strips 11 and which in the Figure are shown disposed at right angles to the remainder of the connector assembly.

The strip 10 of flexible material (see also FIG. 3) is a flexible printed circuit carrying a conductor pattern 10A on one side only. The pattern includes contact areas 12 situated on either face of each of the edge strips 5a and 5b. These contact areas make contact when the connector assembly is used in a system such as that shown in FIG. 1, with the corresponding contact areas of the edge connectors 6, and the thickness of the edge strips 5a and 5b with their packing strips 11 corresponds to the thickness of the slots in the edge connectors 6.

The arrangement of the printed conductors will now be described with reference to FIG. 4. This figure shows a part only of the complete strip 10 containing a representative group of conductor paths. For clarity it does not show the edge strip 5a and 5b as being at right angles to the remainder of the connector assembly, nor the strips 11. Also the various sections of the substrate 10 have been grossly exaggerated to show the layers separated.

The substrate strip 10 has an inner tab 13 joined by a region of flexure of bending 14 to a section 15 which is shown part broken away, then successive sections 16 to 18 joined by regions of flexure 19 to 21; and finally an outer tab 22 joined to the section 18 by a region of flexure 23.

Contact areas 12a are provided on one face of the section 17 of the substrate strip 10 in such locations that they are at the regions of the edge strip 5a. The areas 12a are connected by conductor tracks 26 which run along the section 17 and round the region of flexure 20 to the section 16. As seen in the Figure this will be at the underside of the section 16. Each such conductor terminates at the section in a part 27, these parts being located in the region of the edge strip 5b.

Each pad 27 connects with a ring 28 provided upon the same face of the strip section 18 positioned so as to be on the underside o the section 18. The substrate at the centre of the ring 28 is pierced and the connection between the ring 28 at pad 27 is made by soldering. This method of providing electrical connections from one side of the substrate to the other is used for all the interlayer connections in this form of connector. The ring 28 is connected to a contact area 12b on the underside of the section 18. This contact area is so positioned on the strip section 18 that when the strip is deformed to provide the structure of the FIGS. 2 and 4 this contact area is at the opposite face of the edge strip 5b to the face of the edge strip 5a which carries the contact area 12a to which it is connected.

Further connections are made between contact areas on the other pair of opposite faces of the two edge strips. Thus each of a set of contact areas 12c on the outer tab 22 is connected via a ring and pad combination to a track 29 on the section 17. Each track 29 runs round the same region of flexure 20 as the other set of tracks 26 to the underside of the section 16, and then across it to the far side, where it is connected by a pad and ring to a contact area 12d.

These two sets of connections connect the signal tracks of the boards 2 in the interconnection system described. The ground planes are connected by a mesh-like conductor pattern 30 on the section 15 which is connected to contact areas 12e on all four faces of the edge strips 5a and 5b. To those on the upper faces of the two edge strips (as seen in the figure) it is connected by, in the case of edge strip 5a, a pad and ring, and, in the case of the edge strip 5b, a pad and ring with the soldering passing through an intervening pierced ring 31 in the section 17. To those on the lower faces (as seen on the figure) it is connected by a track 32 passing round the region of flexure 19 to end in a pad on the section 16, and a track 33 passing round the region of flexure 14 to end in a pad on the inner tab 13. These pads are connected to the contact areas on the lower faces in a similar fashion to the way the connections are made to the upper faces.

In the interconnection system described the pattern 30 acts as an extension of the ground planes of the boards 2. It ensures the correct transmission characteristics and a return path for the signals carried by the tracks 26 and 29.

As examples of suitable materials, the flexible substrate 10 may be of polyimide or polyester. The conductor pattern is formed by conventional printed circuit techniques and may, for example, be of copper with the contact areas 12 overplated with gold or nickel and gold. Overall electrical insulation may be provided by cover layers of flexible insulating material bonded to the assembly as required.

The connector assembly is assembled as follows. First, holes are punched in the positions required for interlayer connections, that is, in the centres of the rings such as the rings 28 and 31. Then the substrate 10 is coated with a suitable adhesive, for example a thermosetting polyester resin or cyanoacrilate. The substrate is then wound round the packing strips 11. To ensure correct locating of the substrate on the strips 11 the strips have holes at either end and the substrate has matching holes both of which engage with pegs suitably positioned on an assembly fixture. After the adhesive has set, the interlayer connections are made with buttons of solder. Finally, notches, required for example to locate the final connector correctly in the edge connectors 6, are cut in the edge strips 5 consisting of the packing strips 11 and the substrate 10 around them.

The various sections of the substrate 10, instead of being equal, are chosen to be such that the connector adopts the desired configuration with turned-up ends without the layers buckling.

The final connector, although not flexible to the same extent as a single-layer flexible circuit, has a measure of flexibility which allows it to tolerate some departure of the positions of the boards 2 from their nominal positions.

The second form of connector assembly differs from the first in having the contact areas on separate pieces rather than on the same substrate as the conductor paths, and in duplicating the mesh for the ground connection so that there is a mesh on each side of the layer concerned.

Referring to FIG. 5, the contact areas 12 are provided on flexible pieces 34. These pieces are placed over the substrate 10 in the region of the packing strips 11 with their ends turned in and secured by adhesive which is kept clear of the turned-in edges. A track 35 runs from each contact area 12 and ends in a broadened part (not shown) in the region of the turned-in edge. The tracks on the substrate 10 end in similar broadened parts (not shown in FIG. 5) situated on the parts of the substrate 10 that are turned up against the packing strips 11. The two set of broadened parts from the pieces 34 and the substrate 10 face and are in contact with one another. They are then joined by reflow soldering, as shown at 36.

Referring to FIG. 6, which shows the substrate 10 in a manner corresponding to FIG. 4, but with only enough tracks to show the manner in which the interconnections are made, the substrate 10 has only three sections, an inner one 37 and two outer ones 38 and 39 joined by a region of flexure 40. There are two sets of tracks which, in a system such as that of FIG. 1, transmit signals. Tracks 41 and 42 are a representative track from each set. The track 41 starts with a broadened part 43 on the section 38 at the far end from the region of flexure 40, runs round the region of flexure 40 and ends near it in a broadened part 44. The track starts near the region of flexure 40 in a broadened part runs round it and onto the underside of the section 39 and ends near the far end of the section 39 in a broadened part 45.

The inner section 37 carries two meshes, 47 and 48, on top and bottom respectively as seen in the figure. The mesh 47 is joined at either end by button soldering to a track 49 ending in a broadened part 50 and a track 51 ending in a broadened part 52. The mesh 48 is similarly joined to track 53 ending in a broadened part 54 and a track 55 ending in a broadened part 56. The various broadened parts at the ends of tracks, 43–46, 50, 52, 54 and 56 are the ones which are soldered to the corresponding broadened parts of the tracks 35 connected to the contact areas 12 on the separate pieces 34. These broadened parts are overplated with, for example tin-lead for easy solderability. Various modifications are possible in both forms of connector. For example, there may be cut-out panels spaced apart from one another in a direction parallel to that in which the edge strips 5 run. This arrangement increases the lateral flexibility of the connector (i.e. the ability of the edge strips to move parallel to one another). The tracks will then need to be brought closer together as they pass between the cut-out panels if even spacing of the contact fingers on the edges is to be maintained.

The edge strips need not be turned up if the slots of the two connectors they are to engage face one another rather than being parallel.

The second form may be modified by soldering edge connectors to the flexible substrate instead of the flexible pieces 34. The connectors may then, if the edges are not turned up, mate with contact fingers formed on the edges of the boards 2.

The function of the tracks may not be as signal or ground interconnections in the manner explained if the connector forms part of a different interconnection system.

I claim:

1. An electrical connector cable assembly having an integrally formed edge connector element at each end thereof for electrically interconnecting first and second edge type connector units each having first and second contact arrays located on opposite sides of a connector unit receiving region so that the first contact arrays of the first and second connector units are interconnected and the second contact arrays of the first and second connector units are interconnected, the assembly comprising;

two elongate connector element stiffening members each providing first and second surfaces separated by a predetermined distance; a length of electrically non-conductive substrate folded about the two stiffening members so that the first and second surfaces of the stiffening members are covered by the substrate material and are interconnected by at least three side-by-side layers of the substrate;

the substrate having on a first surface thereof two groups of contact areas each including first and second arrays of electrical contact areas, extending across the width of the substrate, the arrays being so located on the substrate first surface that when the substrate is folded about the stiffening members a said first contact array coincides with each of the stiffening member first surfaces and a said second contact array coincides with each of the stiffening member second surface;

a first electrical conductor system provided on the substrate first surface interconnecting the first arrays of the first and second groups and a second electrical conductor system provided on the substrate first surface interconnecting the second arrays of the first and second groups.

2. An electrical connector cable assembly having an integrally formed edge connector element at each end thereof, for electrically interconnecting first and second edge type connector units each having first and second contact arrays located on opposite sides of a connector unit receiving region so that the first contact arrays of the first and second connector units are interconnected and the second contact arrays of the first and second connector units are interconnected, the assembly comprising;

an electrically non-conductive substrate of a predetermined length and width and presenting first and second major surfaces, the substrate being folded to provide a fold-free portion including at least three overlapping side-by-side lengths, with said portion being terminated at each end by first and second end regions each incorporating at least one fold in the substrate, with each said end region presenting first and second outer side-faces;

first and second groups of electrical contact areas provided on the first major surface of the substrate; each said group including first and second arrays of electrical contact areas extending across the width of the substrate and being positioned as to be complementary to the arrays of the connector units; said arrays also being so positioned relative to the length of the substrate that when the substrate is in its folded condition the first and second contact area arrays of the first group are respectively located on said first and second side faces of the first end region whereby the latter provides the first connector element, and the first and second contact area arrays of the second group are respectively located on said first and second side faces of the second end region whereby the latter provides the second connector element;

a first electrical conductor system provided on the first major surface of the substrate interconnecting the first arrays of the first end region to the first arrays of the second end region; and a second electrical conductor system provided on the first major surface of the substrate interconnecting the second arrays of the second end region to the second arrays of the second end regions.

3. An electrical connector cable assembly as claimed in claim 2, and including a stiffening strip for each said end region, each said stiffening strip having side faces which co-operate with said side faces of the associated end region.

4. An electrical connector cable assembly as claimed in claim 2, in which the substrate is folded at least twice in the same sense to form an inner section, a first outer section joined to the inner section by a first zone of fold and a second outer section joined to the first outer section by a second zone of fold, which second zone takes this second outer section to the opposite side of the folded substrate to the first outer section.

5. An electrical connector cable as claimed in claim 4, in which the two conductor arrangements are so provided on the first surface of the substrate as to form two sets of conductors running lengthwise of the substrate, with the opposite end regions of one set terminating at first and second locations for through conductive paths through the substrate, with one end region of the other set terminating at third locations for through conductive connections through the substrate, and with the other end regions of the other set connecting with the contact areas of one of the arrays of the first group of contact areas, said first, second and third through conductive connections being so spaced along the length direction of the substrate with respect to the remaining arrays of contact areas that on folding the substrate to the folded condition that provides the inner and outer sections the first, second and third conductive connections are brought into electrical contact with the relevant arrays of contact areas whereby the two groups of contact areas are interconnected as required.

6. An electrical connector cable assembly as claimed in claim 4, in which the inner section is provided with an effectively uniform conductor path which crosses the second zone of fold, and which is provided on the first surface of the substrate.

7. An electrical connector cable assembly as claimed in claim 6, in which the effectively uniform conductor path provides a ground plane facility.

8. A method of fabricating an electrical connector cable assembly having an integrally formed edge connector element at each end thereof, for electrically interconnecting first and second edge type connector units each having first and second contact arrays located on opposite sides of a connector unit receiving region so that the first contact arrays of the first and second connector units are interconnected and the second contact arrays of the first and second connector units are interconnected, the method comprising, providing an electrically non-conductive substrate of a predetermined length and width and presenting first and second major surfaces; folding the substrate to provide a fold-free portion including at least three overlapping side-by-side lengths, with said portion being terminated at each end by first and second end regions each incorporating at least one fold in the substrate, with each said end region presenting first and second outer side-faces;

providing first and second groups of electrical contact areas on the first major surface of the substrate; each said group including first and second arrays of electrical contact areas extending across the width of the substrate and being positioned as to be complementary to the arrays of the connector units; said arrays also being so positioned relative to the length of the substrate that when the substrate is folded the first and second contact area arrays of the first group are respectively located on said first and second outer side faces of the first end region whereby the latter provides the first connector element, and the first and second contact area arrays of the second group are respectively located on said first and second outer side faces of the second end region whereby the latter provides the second connector element;

providing a first electrical conductor system on the first main surface substrate interconnecting the first arrays of the first end region to the first arrays of the second end region; and providing a second electrical conductor system on the first main surface of the substrate interconnecting the second arrays of the first end region to the second arrays of the second end region.

9. A method of fabricating an electrical connector cable assembly as claimed in claim 8, and including the step of providing a stiffening strip for each said end region, each said stiffening strip having side faces which co-operate with said side faces of the associated end region.

* * * * *